United States Patent [19]

Mallicoat

[11] Patent Number: 4,791,433
[45] Date of Patent: Dec. 13, 1988

[54] LINE SCAN GRAPHIC RECORDER AND METHOD FOR INTENSITY CONTROL VIA MEDIUM VELOCITY ASSESSMENT

[75] Inventor: Samuel W. Mallicoat, Portland, Oreg.

[73] Assignee: Tektronix, Inc., Beaverton, Oreg.

[21] Appl. No.: 463,353

[22] Filed: Feb. 2, 1983

[51] Int. Cl.⁴ .......................... G01D 9/02; G01G 15/14
[52] U.S. Cl. ................................ 346/1.1; 346/110 R; 346/136
[58] Field of Search .................... 346/110 R, 136, 1.1; 355/20

[56] References Cited

U.S. PATENT DOCUMENTS

| | | | |
|---|---|---|---|
| 4,095,235 | 6/1978 | Quarton | 346/110 R |
| 4,335,390 | 6/1982 | Axford | 346/158 X |
| 4,412,230 | 10/1983 | Goldberg | 346/110 R |
| 4,442,442 | 4/1984 | O'Dell | 346/136 |

*Primary Examiner*—Elliot Goldberg
*Assistant Examiner*—Gerald E. Preston
*Attorney, Agent, or Firm*—Francis I. Gray; Allston L. Jones

[57] ABSTRACT

In a line scan fiber optic cathode ray graphic recorder a continuous sheet of light sensitive paper is drawn perpendicularly before a regularly timed intensity modulated beam from the cathode ray tube. Due to gearing inaccuracies and anomalies, the velocity at which the paper is drawn past the beam varies cyclically resulting in a variation in the spacing between each recorded data line on the paper. For higher paper velocities, the recorded lines are closer together, and for lower paper velocities, the recorded lines are farther apart. The closer lines create a darker image band on the paper and the more distant lines create a lighter image band on the paper. The present invention includes paper velocity monitoring means which provides an input signal to a compensation circuit for inversely varying the intensity information of each pixel dot as a function of the paper velocity. That is for higher than average velocities, the image intensity is proportionately reduced and at lower than average velocities the image intensity is proportionately increased to create a more uniform appearance of the total recorded image on the paper.

12 Claims, 2 Drawing Sheets

NORMAL     SKEW     ECCENTRIC

LINE SCAN GRAPHIC RECORDER AND METHOD FOR INTENSITY CONTROL VIA MEDIUM VELOCITY ASSESSMENT

BACKGROUND OF THE INVENTION

The present invention relates generally to a recording apparatus, more specifically to a line scan recording apparatus.

Various types of recording apparatus have been widely used for making hard copies of images. In one type, the recording medium, typically light sensitive paper, perpendicularly traverses a marking means in the form of an intensity modulated deflectable beam, such as the electron beam of a cathode ray tube (CRT), thereby producing on the recording medium a recorded gray scale image representing the input data supplied to the apparatus. One example of the type known as a line scan recording apparatus is that using a fiber optic CRT (FOT). The recording medium is a light-sensitive sheet which is moved across and in contact with the fiber optics strip of the FOT by a sheet drive means. The electron beam of the FOT is moved back and forth along the fiber optics strip while being intensity modulated in accordance with the input data supplied to the apparatus to produce the recorded image.

In such recording apparatus, quality and fidelity of the recorded images depend on the uniformity in velocity at which the recording medium travels. However, short term recording medium velocity fluctuations are unavoidable due to mechanical and electrical characteristics of the recording medium drive means. In order to compensate for the image density distortion due to the short term velocity fluctuations, U.S. Pat. No. 4,172,259 discloses a technique in which the beam of the FOT is deflected vertically in response to the differences in the recording medium velocity by using velocity sensing means, a frequency to voltage converter, a differentiator, an integrator and vertical deflection means to raise or lower the horizontal sweep, for a higher or lower than normal recording medium velocity, respectively.

A predominant factor of the recording medium velocity variation is known as "cogging" which is traceable to imperfections in the motor gear box. As a result of cogging, the recorded image includes what appears to be a repeating light-dark bar pattern superimposed upon the recorded image. This light-dark bar pattern reoccurs with relatively constant spacing therebetween. This spacing is constant regardless of the medium driving speed, indicating its origin is in the drive mechanism. Through measurements, it has been observed that the bar pattern repeats once-per-motor-revolution.

Probably the largest contributing factor to cogging is the misalignment of the worm gear affixed to the shaft of the driving motor and the radial gear on the recording medium transport sub-system. This misalignment can take two forms. The first is a skew between the worm gear and the radial gear. This can result from any of a combination of factors including a bent motor shaft or a gear mounting hole through either the worm gear or the radial gear which is not parallel to the central axis of that gear. The second is an eccentric gear mounting hole through either of the gears. An eccentric mounting hole is one that is parallel to the central axis of the gear, but off center. The normal skew and eccentric alignment of the worm and radial gears is illustrated in FIG. 1.

FIG. 2 illustrates the typical variations of the velocity of the recording medium with $V_o$ being representative of the average value of that velocity. The velocity varies non-sinusoidally as a result of the non-linear way that the pressure between the worm and radial gears builds and releases. The result on the recorded gray-scale image on the recording medium is dark bars when the medium velocity is slowest and light bars when the medium velocity is greatest. The dark bars are caused by the image lines being recorded closer together than those recorded at a slower medium velocity and the light bars are caused by the image lines being recorded farther apart than those recorded at a faster medium velocity. The dark bars have been observed to occur with a 50% duty cycle due to the non-linearities of the light sensitive recording medium.

When using a light sensitive medium to record an image the intensity of the beam exposing the medium is selected to result in interline fill, or bleed, with nominal spacing between the lines of the image to give the total image a continuous appearance. When the line spacing is other than nominal, the individual image lines will either overlap causing a dark bar, or be spaced too far apart resulting in insufficient bleeding between the lines causing light bars or a non-continuous or stretched portion of the total image. A compensation means to reduce or increase the intensity of the beam when the velocity of the recording medium is slower or faster than nominal, respectively, is desirable. Such a device would reduce the over bleeding between close image lines and increase the bleeding between distant image lines. The present invention is believed to provide such a compensation device.

SUMMARY OF THE INVENTION

In accordance with the illustrated embodiments, the present invention provides a method and apparatus for compensating the image intensity in a line scan recorder for variations in the velocity at which the recording medium passes before the image source.

The present invention accomplishes this by first generating a signal that is representative of the actual velocity of the recording medium for each line of the image to be recorded on the medium. The actual velocity information is then utilized to generate a correction factor to the signal that is representative of the nominal selected velocity of the recording medium. That signal is then multiplied by that correction factor with the corrected signal being provided to the Z-axis amplifier of the line scan recorder to adjust the intensity accordingly.

DESCRIPTION OF THE PREFERRED EMBODIMENTS

Figure 1:
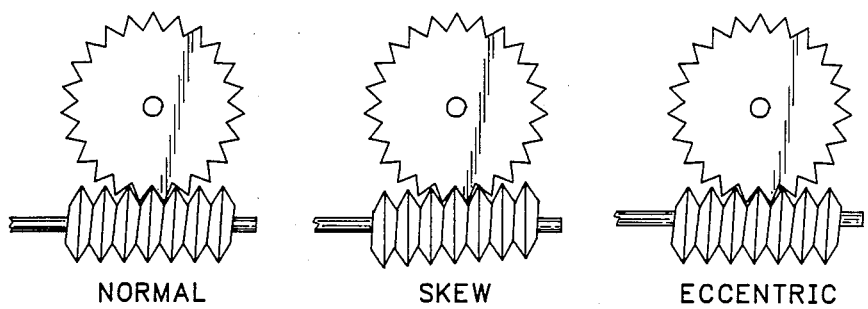
FIG. 1 is a plane view of the three worm/radial gear meshing configurations.
Figure 2:
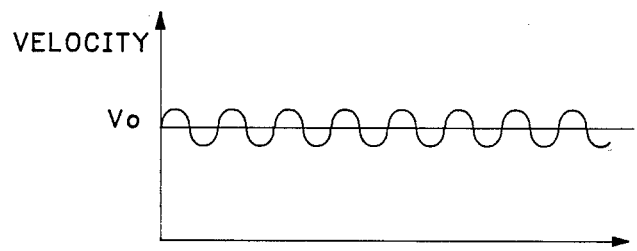
FIG. 2 is a representative non-sinusoidal waveform of the recording medium velocity when cogging is present between the worm and radial gears of the drive mechanism for the recording medium.
Figure 3:
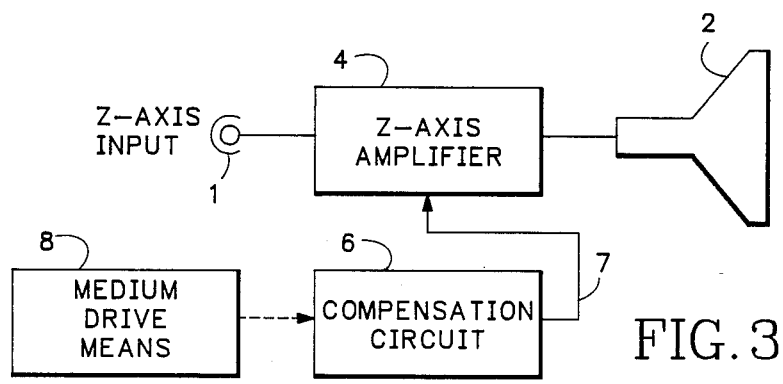
FIG. 3 is a block diagram of a portion of a graphic recorder including the compensation circuit of the present invention.

Referring to FIG. 3 there is shown a block diagram including a fiber optic tube (FOT) 2, a Z-axis amplifier 4 for controlling the pixel by pixel intensity of the image to be displayed by FOT 2 in response to the signal applied at the Z-axis input terminal 1 of amplifier 4. Also shown is medium drive means 8 for transporting the recording medium past the image line on the face of FOT 2. Finally, there is shown a block designated compensation circuit 6 to modulate the intensity of the Z-axis signal to be applied to FOT 2 via Z-axis amplifier 4 via line 7 in response to a signal that is representative of the actual velocity of the recording medium (see broken arrow) to compensate for the resultant light-dark bar pattern of the recorded image due to cogging without such compensation. In the prior art, a fixed voltage level representative of the selected motor 12 speed was applied to line 7 to provide a fixed modulation level signal to Z-axis amplifier 4. This is necessary to increase or decrease the gray scale density for higher or lower motor speeds, respectively, since at high speeds the recorded lines are further apart and at lower speeds the recorded lines are closer together.

Figure 4:
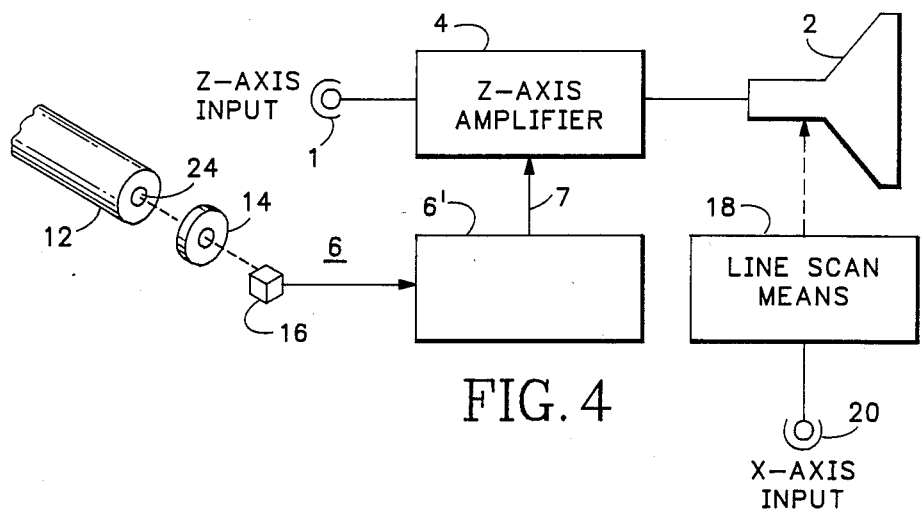
FIG. 4 is a block diagram similar to the diagram of FIG. 3 showing one means for monitoring the velocity of the recording medium.

FIG. 4 shows one embodiment of the recording apparatus in accordance with the present invention. The beam of FOT 2 is moved back and forth along the fiber optics strip by line scan means 18 to which an X-axis input signal is applied via X-axis input 20 at a fixed rate selected to correspond to the recording medium being transported at a constant $V_o$ velocity. Simultaneously, the beam is intensity modulated by Z-axis amplifier 4 to which the Z-axis input signal is applied via Z-axis input terminal 1. Motor 12 of medium drive means 8 drives the recording medium at a predetermined nominal rate $V_o$. Motor phase detection is made by reflective optosensor 16 commercially available (such as Monsanto MCA-7). The light reflected by the "half-moon" light-dark pattern disc 24 on the shaft end of motor 12 is sensed by reflective optosensor 16 through the "D" aperture of rotatable housing 14 therebetween. Housing 14 is set for phase lock to provide the optimum compensation. The output signal of reflective optosensor 16 is representative of the velocity of the recording medium and is applied to compensation circuit 6 for generation of an appropriate modulation signal to compensate for variations in the recording medium velocity.

Figure 5:
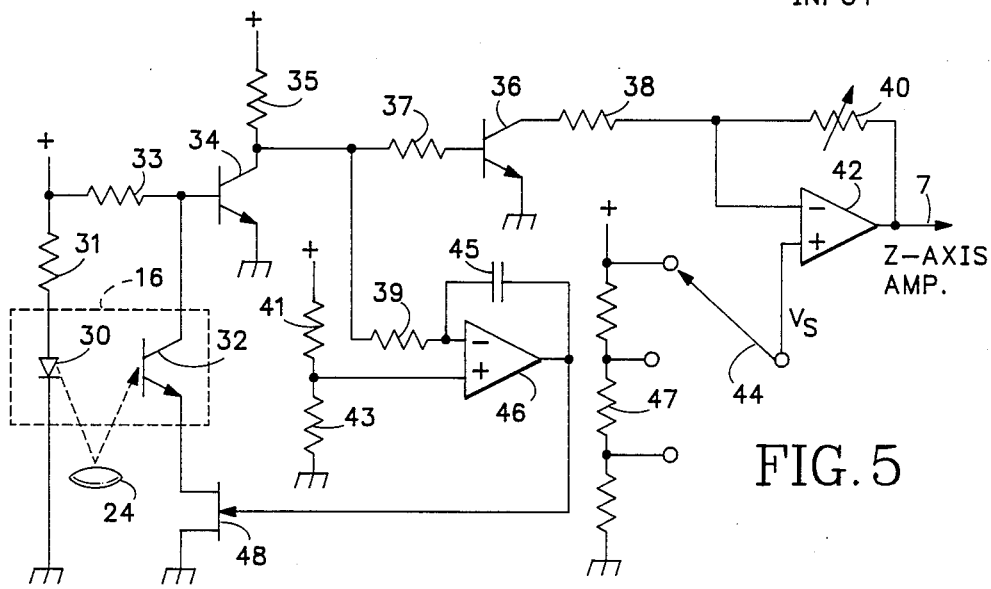
FIG. 5 is a schematic representation of one embodiment of a compensation circuit of the present invention for incorporation into the diagram of FIG. 3.

FIG. 5 shows one embodiment of compensation circuit 6 in accordance with the present invention which includes the reflective optosensor 16 as discussed in relation to FIG. 4. In this figure, optosensor 16 is shown as a light emitting diode (LED) 30 in combination with phototransistor 32. The anode of LED 30 is connected to the positive power supply via a resistor 31 and the cathode of LED 30 is grounded. The collector of phototransistor 32 is connected to the positive power supply via a resistor 33, and the emitter of phototransistor 32 is grounded via the drain-source channel of field effect transistor (FET) 48. The collector of transistor 32 is also connected to the base of transistor 34 with the collector thereof connected to the positive power supply via a resistor 35, and the emitter thereof grounded.

The collector of transistor 34 is also connected to the base of transistor 36 and the inverting input of amplifier 46 via resistors 37 and 39, respectively. The non-inverting input of amplifier 46 is connected to a voltage divider including resistors 41 and 43 connected between the positive power supply and ground. The feedback element of amplifier 46 is capacitor 45 connected between the inverting input and the output of amplifier 46. In this configuration amplifier 46 is an integrator. The output of amplifier 46 is also connected to the gate of FET 48. The collector of transistor 36 is connected via resistor 38 to the inverting input of amplifier 42 wherein variable resistor 40 is connected between the inverting input and the output, and the non-inverting input is connected to switch 44 which is in communication with voltage divider 47. Switch 44 may be, or may be ganged with, the motor speed selection switch so that the voltage applied to amplifier 42 via switch 44 is proportional to the selected motor speed. That voltage, without modification, would be the voltage applied to line 7 in a prior art line scan recorder. The output of amplifier 42 is fed to Z-Axis amplifier 4.

In operation, LED 30 illuminates a half-moon pattern disc 24 on the motor shaft (see FIG. 4). The alternating light and dark pattern viewed by transistor 32 through the "D" aperture in rotatable housing 14 (see FIG. 4), creates a square wave having nearly a 50% duty cycle and applies that signal to the collector of transistor 34. Amplifier 46 senses the duty cycle of this square wave, and adjusts it for 50% via FET 48 by varying the drain-source voltage to adjust the bias on the base of transistor 34. Transistor 36 acts as a switch, and modulates the gain of amplifier 42 from 1 to $(1+R_2/R_1)$ where resistors 38 and 40 have resistances $R_1$ and $R_2$, respectively. Motor speed information via switch 44 is corrected for instantaneous variation in the actual recording medium velocity by the signal from transistor 36 to adjust the gray scale level for cogging. Accordingly, the output signal of amplifier 42 is a square wave having low and high levels of Vs and $V_s(1+R_2/R_1)$, respectively. The phase and amplitude of the square wave are adjustable for the best compensation, respectively, by rotatable housing 14 and variable resistor 40.

Figure 6:
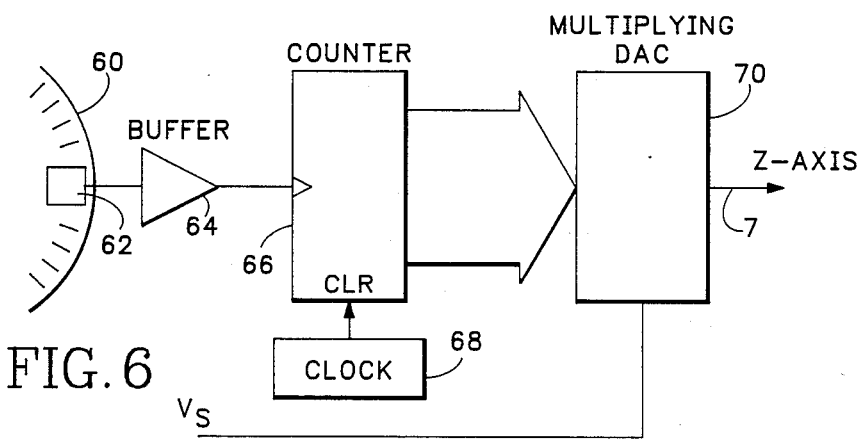
FIG. 6 is a block diagram of a second embodiment of a compensation circuit of the present invention together with a second means for monitoring the velocity of the recording medium for incorporation into the diagram of FIG. 3.

FIG. 6 shows another embodiment of the present invention. A shaft angle encoder is shown affixed to motor 12 for monitoring the velocity of the recording medium. The encoder includes a stepper wheel 60 mounted on the shaft of motor 12 and an optosensor 62 for illuminating and detecting evenly spaced index marks on stepper wheel 60. Each detected index mark results in an output pulse from optosensor 62 which is serially applied to counter 66 via buffer 64. The rotational velocity of motor 12 and, therefore, the average velocity of the recording medium is directly proportional to the pulse number count accumulated by counter 66 within any selected time period.

This embodiment also includes a clock 68 having its output signal coupled to the clear line of counter 66 to define the time period over which the average is taken.

The sample periods as defined by clock 68 should not be less frequent than the period of the X-axis scan pulses (FIG. 4), and for improved accuracy the number of index marks on stepper wheel 60 could be increased to a number close to the maximum number detectable by optosensor 62 at the highest motor speed.

The count accumulated by counter 66 is transferred to a multiplying digital-to-analog converter (DAC) 70 each time counter 66 is cleared. DAC 70 corrects the signal $V_s$, which is representative of the selected motor speed, for cogging in response to the output count of counter 66. The output of DAC 70 is applied to Z-axis amplifier to modulate the Z-axis signal. As the recording medium velocity increases, a larger count develops which, in turn, provides a larger output from DAC 70 and a higher beam intensity of FOT 2. Thus, the lowered exposure due to the increased recording medium velocity is compensated for by increased beam drive.

According to this embodiment, compensation is provided not only for sheet velocity variations occurring once per motor revolution, but for those caused from other factors (e.g. drive roller irregularities). In addition, no adjustment is required in this embodiment.

Having described specific embodiments hereinbefore, it is obvious the modifications and variations of the present invention are possible without departing from the spirit and scope thereof.

I claim:

1. A method of varying the intensity of each scan line to be displayed and recorded on a light sensitive medium by a line scan graphic recorder in response to fluctuations of the selected velocity of the recording medium driving means to improve the complete recorded image on the medium, the method comprising the steps of:
    a. generating a signal having characteristics that are directly proportional to the instantaneous velocity of the recording medium immediately prior to the display of each scan line;
    b. modulating the intensity of the corresponding scan line, as it is displayed and recorded, by the signal of step a.; and
    c. repeating steps a. and b. for each scan line to be displayed and recorded.

2. A method as in claim 1 wherein step b. includes the step of:
    d. modifying a signal representative of the selected nominal velocity of the recording medium driving means by the signal of step a.; and
    e. modulating the intensity of the scan line to be displayed and recorded by the signal of step d.

3. A method as in claim 2 wherein step a. includes the steps of:
    f. monitoring the velocity of the recording medium driving means optically; and
    g. generating a signal representative of the velocity of the drive means from the optical signal of step f.

4. A method as in claim 2 wherein step d. includes the step of:
    h. multiplying the signal representative of the selected nominal velocity of the recording medium driving means by the signal of step a.

5. A method as in claim 3 wherein step a. further includes the steps of:
    i. serially integrating the successive signals generated by step g.;
    j. adjusting the duty cycle of the signal of step g. to substantially 50% in response to the integrated signal of step i.; and
    k. generating a gain factor representative of the difference between the velocity of the recording medium driving means and the selected nominal velocity of the recording medium driving means.

6. A method as in claim 2 wherein step a. includes the steps of:
    l. optically detecting index marks on a stepper wheel coupled to the recording medium driving means and generating a pulse representative of each detected index mark; and
    m. accumulating a count of the pulses from step l. during a period substantially equal to the period between displayed line scans of the recorder.

7. Apparatus for varying the intensity of each scan line to be displayed and recorded on a light sensitive medium by a line scan graphic recorder in response to fluctuations of the selected velocity of the recording medium driving means to improve the complete recorded image on the medium, the apparatus comprising:
    means for generating a signal having characteristics that are directly proportional to the instantaneous velocity of the recording medium immediately prior to the display of each scan line; and
    means for modulating the intensity of each scan line as it is displayed and recorded, in response to the signal generation means.

8. Apparatus as in claim 7 wherein the compensating means includes:
    means for modifying a signal representative of the selected nominal velocity of the recording medium driving means in response to the signal generation means; and
    means for modulating the intensity of the scan line to be displayed and recorded in response to the modifying means.

9. Apparatus as in claim 8 wherein the signal generation means includes:
    means for optically monitoring the velocity of the recording medium driving means; and
    means responsive to the optical monitoring means for generating a signal representative of the velocity of the drive means.

10. Apparatus as in claim 8 wherein the modifying means includes means for multiplying the signal representative of the selected nominal velocity of the recording medium driving means by the signal from the generation means.

11. Apparatus as in claim 9 wherein the signal generation means further includes:
    means for serially integrating the successive signals from the means responsive to the optical monitoring means;
    means for adjusting the duty cycle of the signal from the means responsive to the optical monitoring means to substantially 50% in response to the integration means; and
    means for generating a gain factor representative of the difference between the velocity of the recording medium driving means and the selected nominal velocity of the recording medium driving means.

12. Apparatus as in claim 8 wherein
the signal generation means includes:
    means for optically detecting index marks on a stepper wheel coupled to the recording medium driving means and generatng a pulse representative of each detected index mark; and
    means for accumulating a count of the pulses from the optical detecting means during a period substantially equal to the period between the line scans of the recorder.

* * * * *